(12) United States Patent
Jiang et al.

(10) Patent No.: US 11,127,599 B2
(45) Date of Patent: Sep. 21, 2021

(54) METHODS FOR ETCHING A HARDMASK LAYER

(71) Applicant: Applied Materials, Inc., Santa Clara, CA (US)

(72) Inventors: Shan Jiang, San Jose, CA (US); Gene Lee, San Jose, CA (US); Akhil Mehrotra, Sunnyvale, CA (US); Zohreh Hesabi, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/245,251

(22) Filed: Jan. 10, 2019

(65) Prior Publication Data

US 2019/0221441 A1    Jul. 18, 2019

Related U.S. Application Data

(60) Provisional application No. 62/616,935, filed on Jan. 12, 2018.

(51) Int. Cl.
*H01L 21/311* (2006.01)
*H01J 37/32* (2006.01)

(52) U.S. Cl.
CPC .. *H01L 21/31122* (2013.01); *H01J 37/32522* (2013.01); *H01J 37/32724* (2013.01); *H01L 21/31144* (2013.01)

(58) Field of Classification Search
None
See application file for complete search history.

(56) References Cited

U.S. PATENT DOCUMENTS

| 9,287,124 | B2* | 3/2016 | Kong | H01J 37/3244 |
| 9,390,923 | B2* | 7/2016 | Yoo | H01L 21/3065 |
| 9,418,867 | B2* | 8/2016 | Kong | H01L 21/31144 |
| 10,714,355 | B2* | 7/2020 | Sato | H01J 37/32853 |
| 2007/0004190 | A1* | 1/2007 | Dambrauskas | H01L 24/11 438/613 |
| 2007/0026682 | A1* | 2/2007 | Hochberg | C23F 4/00 438/710 |
| 2009/0181487 | A1* | 7/2009 | Mori | G02B 26/0841 438/50 |
| 2009/0275202 | A1* | 11/2009 | Tanaka | H01L 21/3065 438/700 |
| 2011/0244686 | A1* | 10/2011 | Aso | H01L 21/30655 438/694 |

(Continued)

*Primary Examiner* — Allan W. Olsen
(74) *Attorney, Agent, or Firm* — Patterson + Sheridan, LLP

(57) ABSTRACT

Methods for etching a hardmask layer to transfer features into a material layer using an etch process are provided. The methods described herein advantageously facilitate profile and dimension control of features through a proper sidewall and bottom management scheme during the hardmask open process. In one embodiment, a method for etching a hardmask layer to form features in the hardmask layer includes supplying an etching gas mixture onto a substrate to etch an exposed portion of a hardmask layer exposed by a patterned photoresist layer disposed on the substrate, switching the etching gas mixture to a deposition gas mixture comprising a silicon containing gas to form a passivation layer on sidewalls of the hardmask layer and forming openings in the hardmask layer.

20 Claims, 4 Drawing Sheets

(56) References Cited

U.S. PATENT DOCUMENTS

| | | |
|---|---|---|
| 2012/0322234 A1* | 12/2012 | Yalamanchili ....... B23K 26/364 |
| | | 438/462 |
| 2013/0109188 A1* | 5/2013 | Kim .................. H01L 21/32139 |
| | | 438/710 |
| 2014/0001441 A1 | 1/2014 | Kim et al. |
| 2014/0213059 A1* | 7/2014 | Doan ................ H01L 21/30621 |
| | | 438/694 |
| 2014/0227876 A1* | 8/2014 | Tohnoe ............. H01L 21/76898 |
| | | 438/695 |
| 2014/0339507 A1 | 11/2014 | Leobandung |
| 2015/0333162 A1 | 11/2015 | Bouche et al. |
| 2015/0372115 A1 | 12/2015 | Koh et al. |
| 2016/0293441 A1* | 10/2016 | Lee ..................... H01L 27/1157 |
| 2017/0076955 A1* | 3/2017 | Hudson ............. H01L 21/67167 |
| 2017/0178920 A1* | 6/2017 | Dole ................. H01L 21/31116 |
| 2018/0068862 A1* | 3/2018 | Terakura .................. H05H 1/46 |
| 2018/0151333 A1* | 5/2018 | Katsunuma ....... H01J 37/32366 |
| 2018/0337047 A1* | 11/2018 | Fung ................ H01L 21/31116 |
| 2019/0157066 A1* | 5/2019 | Zhou ................ H01L 21/02274 |
| 2019/0157095 A1* | 5/2019 | Zhou ..................... C23C 16/401 |

\* cited by examiner

METHODS FOR ETCHING A HARDMASK LAYER

CROSS-REFERENCE TO RELATED APPLICATIONS

This application claims benefit of U.S. Provisional Application Ser. No. 62/616,935 filed Jan. 12, 2018, which is incorporated by reference in its entirety.

BACKGROUND OF THE DISCLOSURE

Field

The embodiments herein generally relate to an etching process for etching a hardmask layer, such as a dielectric layer, with high selectivity and good profile control.

Description of the Background Art

Reliably producing submicron and smaller features is one of the key requirements of very large scale integration (VLSI) and ultra large scale integration (ULSI) of semiconductor devices. However, with the continued miniaturization of circuit technology, the dimensions of the size and pitch of circuit features, such as interconnects, have placed additional demands on processing capabilities. The multilevel interconnects that lie at the heart of this technology require precise imaging and placement of high aspect ratio features, such as vias and other interconnects. Reliable formation of these interconnects is critical to further increases in device and interconnect density. Additionally, forming sub-micron size features and interconnects with reduced waste of intermediate materials, such as resists and hardmask materials, is desired.

As feature sizes have become smaller, the demand for higher aspect ratios, defined as the ratio between the depth of the feature and the width of the feature, has steadily increased to 20:1 and even greater. Developing etch processes that are capable of reliably forming features with such high aspect ratios presents a significant challenge. Traditionally, features in a material layer having aspect ratios of about 10:1 or so were fabricated by anisotropically etching dielectric layers to a predetermined depth and width.

During etching, redeposition or build-up of by-products or other materials generated during the etching process may accumulate on the top and/or sidewalls of the features being etched, thereby blocking the opening of the feature being formed in the material layer. As the opening of the etched features are narrowed and/or sealed by the accumulated redeposition of material, the reactive etchants are prevented from reaching the lower surface of the features, thus limiting the aspect ratio that may be obtained. Additionally, as the redeposition material or build-up of by-products may randomly and/or irregularly adhere to the top surface and/or sidewalls of the features being etched, the resulting irregular profile and growth of the redeposition material may alter the flow path of the reactive etchants, thus resulting in bowing or twisting profiles of the features formed in the material layer.

Furthermore, in some cases, after the etching process, the corner features often suffer from rounded top shoulder erosion or undesired non-vertical sidewall etched profile, resulting in critical dimension (CD) loss or deformed profiles. In accurate profile or structural dimensions may result in collapse of the device structure, eventually leading to device failure and product low yield. Poor etching selectivity and control occurring during manufacturing processes for such shapes or features in the material layer may undesirably result in an inaccurate profile control, thus eventually leading to device failure.

As the need for accurate pattern transfer for the manufacturing of structures having small critical dimensions and high aspect ratios has become increasingly difficult, an intermediate layer (e.g., silicon oxynitride, silicon carbide or carbon film), called a hardmask layer, is often used with a bottom anti-reflective coating (BARC) and/or an anti-reflective coating (ARC) disposed thereunder along with the photoresist layer to facilitate pattern transfer because of its greater resistance to chemical etchants. After a long period of exposure to the aggressive etchants, the hardmask layer as well as the bottom anti-reflective coating (BARC) and/or an anti-reflective coating (ARC) without sufficient etching resistance or sidewall protection may be damaged, resulting in inaccurate pattern transfer and loss of dimensional control. Thus, during the bottom anti-reflective coating (BARC) and/or an anti-reflective coating (ARC) open process, the occurrence of sidewall profile damage and/or post-etch sidewall roughness in small critical dimension structures pose a significant challenge to structure profile integrity, especially when significant critical dimensions (CD) shrinkage is required during a bottom anti-reflective coating (BARC) and/or an anti-reflective coating (ARC) open process, which may ultimately deteriorate overall device performance.

Therefore, there is a need in the art for improved methods for etching features with high aspect ratios and small dimensions.

SUMMARY

Methods for etching a hardmask layer to transfer features into a material layer using an etch process are provided. The methods described herein advantageously facilitate profile and dimension control of features through a proper sidewall and bottom management scheme during the hardmask open process. In one embodiment, a method for etching a hardmask layer to form features in the hardmask layer includes supplying an etching gas mixture onto a substrate to etch an exposed portion of a hardmask layer exposed by a patterned photoresist layer disposed on the substrate, switching the etching gas mixture to a deposition gas mixture comprising a silicon containing gas to form a passivation layer on sidewalls of the hardmask layer and forming openings in the hardmask layer.

In another embodiment, a method for etching a hardmask layer to form features in the hardmask layer includes etching a hardmask layer disposed on a substrate to a predetermined depth, wherein the predetermined depth is between about 5% and 10% of a total thickness of the hardmask layer, wherein the hardmask layer is a doped amorphous silicon layer, forming a passivation layer on sidewalls of the etched hardmask layer, and repeating the etching of the hardmask layer and the forming of the passivation layer until certain portion of the hardmask layer is removed from the substrate.

In yet another embodiment, a method for etching a hardmask layer to form features in the hardmask layer includes etching a hardmask layer disposed on a substrate to a predetermined depth for a first period of time, forming a passivation layer on sidewalls of the etched hardmask layer for a second period of time, wherein the first period of time is longer than the second period of time; and repeating the etching of the hardmask layer and the forming of the passivation layer until certain portion of the hardmask layer is removed from the substrate.

BRIEF DESCRIPTION OF THE DRAWINGS

So that the manner in which the above recited features of the embodiments herein are attained and can be understood in detail, a more particular description of the disclosure, briefly summarized above, may be had by reference to the examples thereof which are illustrated in the appended drawings.

Figure 1:
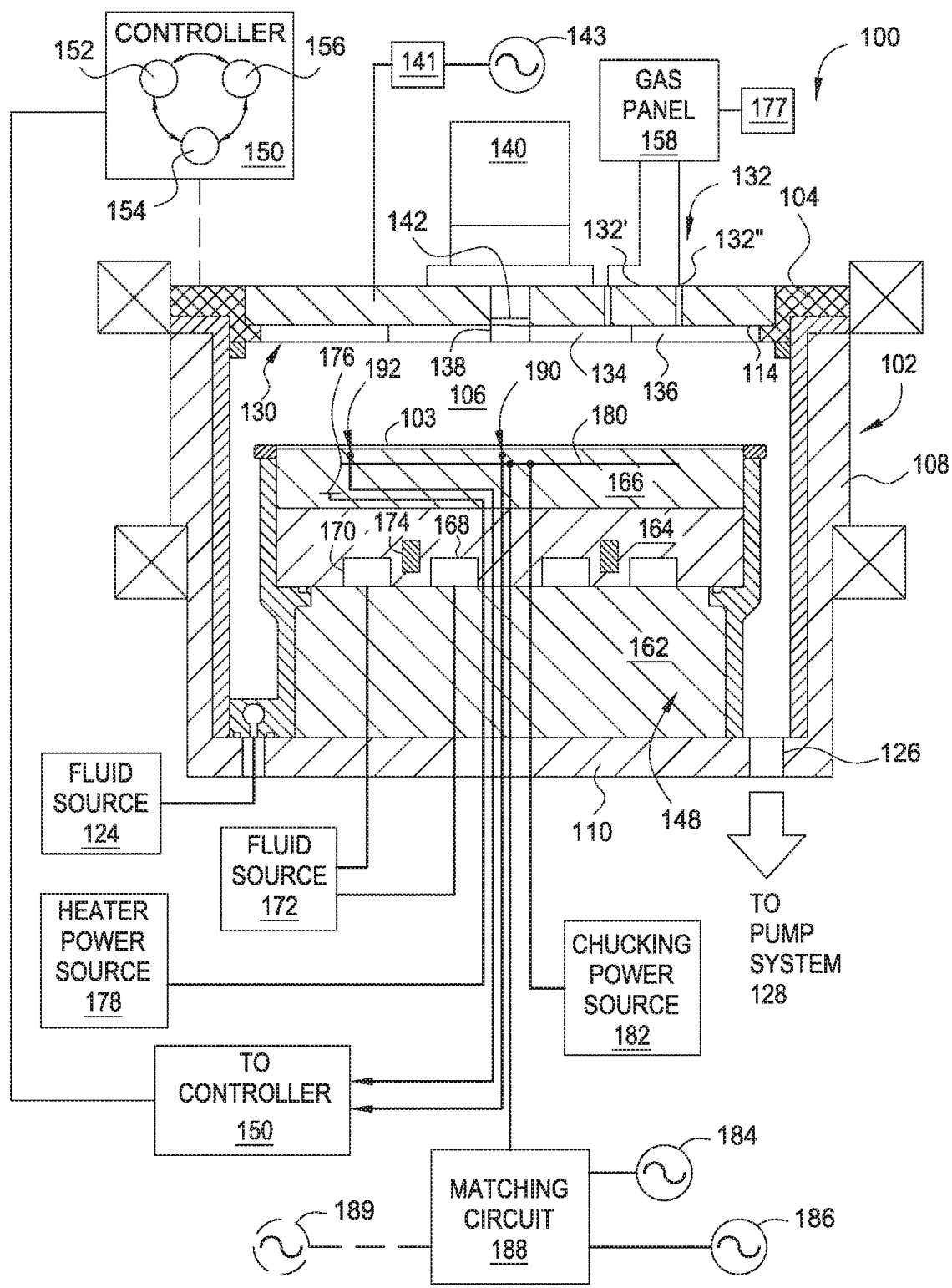
FIG. 1 depicts a processing chamber that may be utilized to etch a dielectric layer.

To facilitate understanding of the embodiments, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary examples and are therefore not to be considered limiting of its scope, for the invention may admit to other equally effective embodiments.

DETAILED DESCRIPTION

Embodiments for the present application include methods for etching a hardmask layer to form feature therein. In one embodiment, the method includes plasma etching a hardmask layer using a controlled gas ratio to form a passivation layer while etching the hardmask layer. By utilizing a passivation layer during etching, a sidewall/surface protection mechanism formed during the etching process is used to efficiently control the etching profile while etching the hardmask layer. The good bottom as well as sidewall protection during the etching process enables etching the hardmask layer with a desired profile, thus assisting transferring features with desired profile to the underlying structures/layers while retaining good profile control and critical dimensions.

FIG. 1 is a sectional view of one example of a processing chamber 100 suitable for performing a patterning/etching process to etch a hardmask layer on a substrate using an etching process. Suitable processing chambers that may be adapted for use with the teachings disclosed herein include, for example, an ENABLER® or SYM3® processing chamber available from Applied Materials, Inc. of Santa Clara, Calif. Although the processing chamber 100 is shown including a plurality of features that enable superior etching performance, it is contemplated that other processing chambers may be adapted to benefit from one or more of the inventive features disclosed herein.

The processing chamber 100 includes a chamber body 102 and a lid 104 which enclose an interior volume 106. The chamber body 102 is typically fabricated from aluminum, stainless steel or other suitable material. The chamber body 102 generally includes sidewalls 108 and a bottom 110. A substrate support pedestal access port (not shown) is generally defined in a sidewall 108 and a selectively sealed by a slit valve to facilitate entry and egress of a substrate 103 from the processing chamber 100. An exhaust port 126 is defined in the chamber body 102 and couples the interior volume 106 to a pump system 128. The pump system 128 generally includes one or more pumps and throttle valves utilized to evacuate and regulate the pressure of the interior volume 106 of the processing chamber 100. In one implementation, the pump system 128 maintains the pressure inside the interior volume 106 at operating pressures typically between about 10 mTorr to about 500 Torr.

The lid 104 is sealingly supported on the sidewall 108 of the chamber body 102. The lid 104 may be opened to allow excess to the interior volume 106 of the processing chamber 100. The lid 104 includes a window 142 that facilitates optical process monitoring. In one implementation, the window 142 is comprised of quartz or other suitable material that is transmissive to a signal utilized by an optical monitoring system 140 mounted outside the processing chamber 100.

The optical monitoring system 140 is positioned to view at least one of the interior volume 106 of the chamber body 102 and/or the substrate 103 positioned on a substrate support pedestal assembly 148 through the window 142. In one embodiment, the optical monitoring system 140 is coupled to the lid 104 and facilitates an integrated deposition process that uses optical metrology to provide information that enables process adjustment to compensate for incoming substrate pattern feature inconsistencies (such as thickness, and the like), provide process state monitoring (such as plasma monitoring, temperature monitoring, and the like) as needed. One optical monitoring system that may be adapted to benefit from the invention is the EyeD® full-spectrum, interferometric metrology module, available from Applied Materials, Inc., of Santa Clara, Calif.

A gas panel 158 is coupled to the processing chamber 100 to provide process and/or cleaning gases to the interior volume 106. In the example depicted in FIG. 1, inlet ports 132', 132" are provided in the lid 104 to allow gases to be delivered from the gas panel 158 to the interior volume 106 of the processing chamber 100. In one implementation, the gas panel 158 is adapted to provide fluorinated process gas through the inlet ports 132', 132" and into the interior volume 106 of the processing chamber 100. In one implementation, the process gas provided from the gas panel 158 includes at least a fluorinated gas, chlorine, a carbon containing gas, an oxygen gas, a nitrogen containing gas, a silicon containing gas and a chlorine containing gas. Examples of fluorinated and carbon containing gases include HF, $CHF_3$, $CH_2F_2$ and $CF_4$. Other fluorinated gases may include one or more of HF, $C_2F$, $C_4F_6$, $C_3F_8$ and $C_5F_8$. Examples of the oxygen containing gas include $O_2$, $CO_2$, CO, $N_2O$, $NO_2$, $O_3$, $H_2O$, and the like. Examples of the nitrogen containing gas include $N_2$, $NH_3$, $N_2O$, $NO_2$ and the like. Examples of the chlorine containing gas include HCl, $Cl_2$, $CCl_4$, $CHCl_3$, $CH_2Cl_2$, $CH_3Cl$, and the like. Suitable examples of the carbon containing gas include methane ($CH_4$), ethane ($C_2H_6$), ethylene ($C_2H_4$), and the like. Examples of the silicon containing gas include $SiH_4$, $SiF_4$, $SiCl_4$ and the like.

A showerhead assembly 130 is coupled to an interior surface 114 of the lid 104. The showerhead assembly 130 includes a plurality of apertures that allow the gases flowing through the showerhead assembly 130 from the inlet ports 132', 132" into the interior volume 106 of the processing chamber 100 in a predefined distribution across the surface of the substrate 103 being processed in the processing chamber 100.

A remote plasma source 177 may be optionally coupled to the gas panel 158 to facilitate dissociating gas mixture from a remote plasma prior to entering into the interior volume 106 for processing. A RF source power 143 is coupled through a matching network 141 to the showerhead assembly 130. The RF source power 143 typically is capable of producing up to about 3000 W at a tunable frequency in a range from about 50 kHz to about 200 MHz.

The showerhead assembly 130 additionally includes a region transmissive to an optical metrology signal. The optically transmissive region or passage 138 is suitable for allowing the optical monitoring system 140 to view the interior volume 106 and/or the substrate 103 positioned on the substrate support pedestal assembly 148. The passage 138 may be a material, an aperture or plurality of apertures formed or disposed in the showerhead assembly 130 that is substantially transmissive to the wavelengths of energy generated by, and reflected back to, the optical monitoring system 140. In one embodiment, the passage 138 includes a window 142 to prevent gas leakage through the passage 138. The window 142 may be a sapphire plate, quartz plate or other suitable material. The window 142 may alternatively be disposed in the lid 104.

In one implementation, the showerhead assembly 130 is configured with a plurality of zones that allow for separate control of gas flowing into the interior volume 106 of the processing chamber 100. In the example illustrated in FIG. 1, the showerhead assembly 130 as an inner zone 134 and an outer zone 136 that are separately coupled to the gas panel 158 through separate inlet ports 132', 132".

The substrate support pedestal assembly 148 is disposed in the interior volume 106 of the processing chamber 100 below the gas distribution (showerhead) assembly 130. The substrate support pedestal assembly 148 holds the substrate 103 during processing. The substrate support pedestal assembly 148 generally includes a plurality of lift pins (not shown) disposed therethrough that are configured to lift the substrate 103 from the substrate support pedestal assembly 148 and facilitate exchange of the substrate 103 with a robot (not shown) in a conventional manner. An inner liner 118 may closely circumscribe the periphery of the substrate support pedestal assembly 148.

In one implementation, the substrate support pedestal assembly 148 includes a mounting plate 162, a base 164 and an electrostatic chuck 166. The mounting plate 162 is coupled to the bottom 110 of the chamber body 102 includes passages for routing utilities, such as fluids, power lines and sensor leads, among others, to the base 164 and the electrostatic chuck 166. The electrostatic chuck 166 comprises at least one clamping electrode 180 for retaining the substrate 103 below showerhead assembly 130. The electrostatic chuck 166 is driven by a chucking power source 182 to develop an electrostatic force that holds the substrate 103 to the chuck surface, as is conventionally known. Alternatively, the substrate 103 may be retained to the substrate support pedestal assembly 148 by clamping, vacuum or gravity.

At least one of the base 164 or electrostatic chuck 166 may include at least one optional embedded heater 176, at least one optional embedded isolator 174 and a plurality of conduits 168, 170 to control the lateral temperature profile of the substrate support pedestal assembly 148. The conduits 168, 170 are fluidly coupled to a fluid source 172 that circulates a temperature regulating fluid therethrough. The heater 176 is regulated by a power source 178. The conduits 168, 170 and heater 176 are utilized to control the temperature of the base 164, thereby heating and/or cooling the electrostatic chuck 166 and ultimately, the temperature profile of the substrate 103 disposed thereon. The temperature of the electrostatic chuck 166 and the base 164 may be monitored using a plurality of temperature sensors 190, 192.

The electrostatic chuck 166 may further comprise a plurality of gas passages (not shown), such as grooves, that are formed in a substrate support pedestal supporting surface of the electrostatic chuck 166 and fluidly coupled to a source of a heat transfer (or backside) gas, such as He. In operation, the backside gas is provided at controlled pressure into the gas passages to enhance the heat transfer between the electrostatic chuck 166 and the substrate 103.

In one implementation, the substrate support pedestal assembly 148 is configured as a cathode and includes an electrode 180 that is coupled to a plurality of RF power bias power sources 184, 186. The RF bias power sources 184, 186 are coupled between the electrode 180 disposed in the substrate support pedestal assembly 148 and another electrode, such as the showerhead assembly 130 or ceiling (lid 104) of the chamber body 102. The RF bias power excites and sustains a plasma discharge formed from the gases disposed in the processing region of the chamber body 102.

In the example depicted in FIG. 1, the dual RF bias power sources 184, 186 are coupled to the electrode 180 disposed in the substrate support pedestal assembly 148 through a matching circuit 188. The signal generated by the RF bias power sources 184, 186 is delivered through matching circuit 188 to the substrate support pedestal assembly 148 through a single feed to ionize the gas mixture provided in the plasma processing chamber 100, thus providing ion energy necessary for performing an etch deposition or other plasma enhanced process. The RF bias power source 184, 186 are generally capable of producing an RF signal having a frequency of from about 50 kHz to about 200 MHz and a power between about 0 Watts and about 5000 Watts. An additional bias power 189 may be coupled to the electrode 180 to control the characteristics of the plasma.

During operation, the substrate 103 is disposed on the substrate support pedestal assembly 148 in the plasma processing chamber 100. A process gas and/or gas mixture is introduced into the chamber body 102 through the showerhead assembly 130 from the gas panel 158. A vacuum pump system 128 maintains the pressure inside the chamber body 102 while removing deposition by-products.

A controller 150 is coupled to the processing chamber 100 to control operation of the processing chamber 100. The controller 150 includes a central processing unit (CPU) 152, a memory 154, and a support circuit 156 utilized to control the process sequence and regulate the gas flows from the gas panel 158. The CPU 152 may be any form of general purpose computer processor that may be used in an industrial setting. The software routines can be stored in the memory 154, such as random access memory, read only memory, floppy, or hard disk drive, or other form of digital storage. The support circuit 156 is conventionally coupled to the CPU 152 and may include cache, clock circuits, input/output systems, power supplies, and the like. Bi-directional communications between the controller 150 and the various components of the processing chamber 100 are handled through numerous signal cables.

Figure 2:
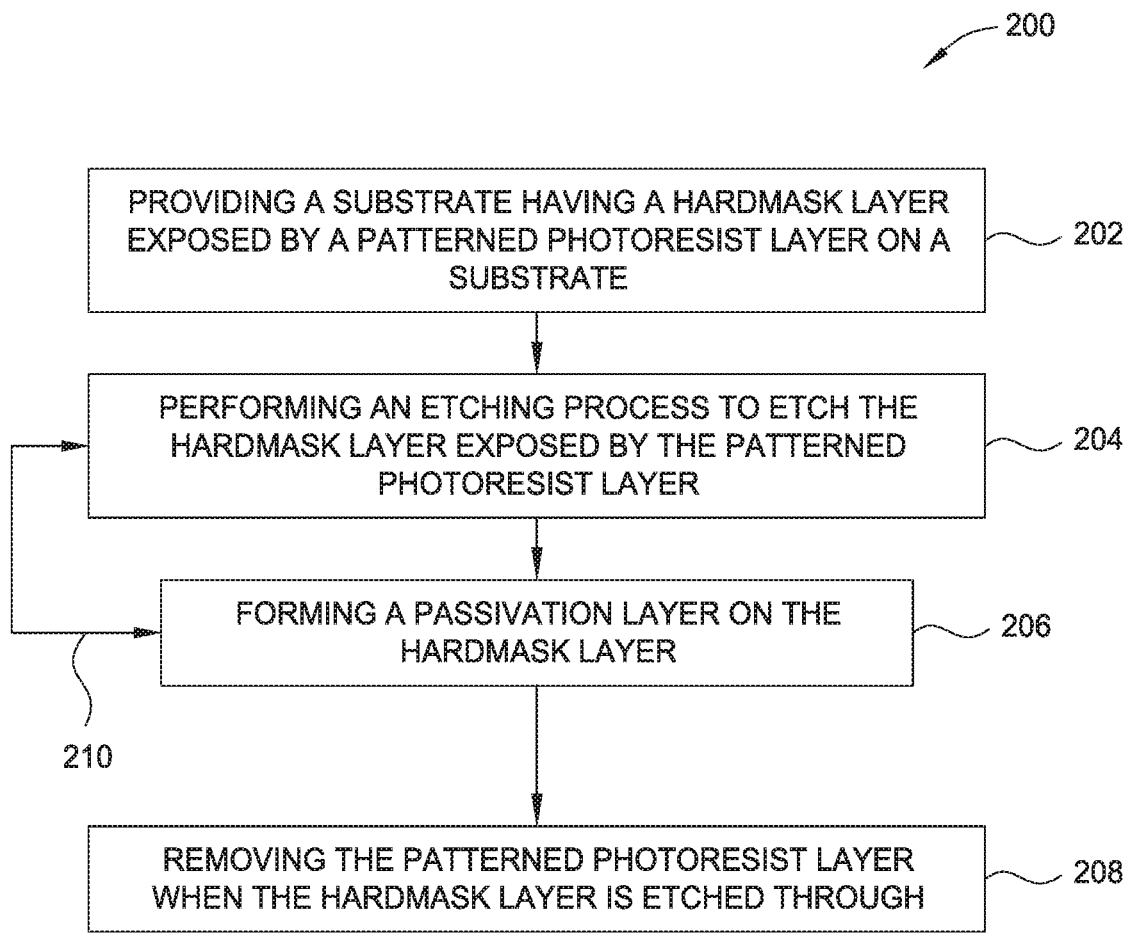
FIG. 2 depicts a flow diagram for performing an etching process for a hardmask layer open process.

FIG. 2 illustrates a flow diagram of a method 200 for etching a hardmask layer, such as a dielectric layer, disposed on a substrate. FIGS. 3A-3D are cross-sectional views of a portion of a substrate 304 with corresponding to various stages of the method 200. The method 200 may be utilized to transfer features into in a material layer with the assistance/masking from the hardmask layer, for forming structures, such as a contact structure, gate structure, NAND structure or interconnection structure for logic or memory devices as needed, in the material layer. Alternatively, the method 200 may be beneficially utilized to etch other types of structures.

The method 200 begins at operation 202 by transferring (i.e., providing) a substrate 304 to an etch process chamber, such as the plasma processing chamber 100 depicted in FIG. 1. In the embodiment depicted in FIG. 3A, the substrate 304 has a film stack 302 that includes a patterned photoresist layer 312 disposed on a hardmask layer 310 disposed on a material layer 308. An optional structure 306 (shown by the dotted line 305) may be formed on the substrate 304 when needed. The optional structure 306 may include composite film layers, including pairs of alternating silicon oxide layer and silicon nitride layers (ONON structure) or pairs of alternating silicon oxide layer and polysilicon layers (OPOP structure). It is noted that the optional structure 306 may be any suitable structures, including a single layer, multiple layers or any other configurations as needed.

The patterned photoresist layer 312 defines openings 314 that expose a surface 316 of the underlying hardmask layer 310 for etching. The substrate 304 may be any one of semiconductor substrates, silicon wafers, glass substrates and the like. The substrate 304 may be a material such as crystalline silicon (e.g., Si<100> or Si<111>), silicon oxide, strained silicon, silicon germanium, germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. The substrate 304 may have various dimensions, such as 200 mm, 300 mm, 450 mm or other diameter, as well as, being a rectangular or square panel. Unless otherwise noted, examples described herein are conducted on substrates with a 200 mm diameter, a 300 mm diameter, or a 450 mm diameter substrate.

In one embodiment, the patterned photoresist layer 312 is a photoresist mask, such as an organic material. The patterned photoresist layer 312 is used as an etch mask to etch features in the hardmask layer 310 (so called hardmask open process), which may be facilitated to serve as an etch mask for patterning the underlying material layer 308 with desired aspect ratios. The features described herein may include trenches, vias, openings and the like. In one embodiment, the patterned photoresist layer 312 is an organic material spin-coated on the substrate 304.

It is noted that additional layers, such as additional mask layer, including ARC layer, DARC layer or BARC layer, may be utilized between the photoresist layer 312 and the hardmask layer 310 to facilitate transferring features into the hardmask layer 310.

The hardmask layer 310 may be a single layer or multiple layers of material selected from a group consisting of silicon, silicon oxide, silicon nitride, silicon oxynitride, silicon carbide, amorphous carbon, doped amorphous carbon, carbon containing materials, and combinations thereof. In an exemplary embodiment depicted herein, the hardmask layer 310 is a doped amorphous carbon layer, such as tungsten doped amorphous carbon layer, boron doped amorphous carbon or other suitable doped amorphous carbon layer. One example of the doped amorphous carbon layer is a tungsten-doped amorphous carbon layer, an Avina™ mask layer, available from Applied Materials, Inc.

In one example the material layer 308 is a dielectric material. Suitable exemplary materials for the dielectric layer include undoped silicon glass (USG), such as silicon oxide or TEOS, boron-silicate glass (BSG), phosphorus-silicate glass (PSG), boron-phosphorus-silicate glass (BPSG), high-k material, low dielectric constant insulating materials (e.g., dielectric constants less than about 4.0) and combinations thereof. Examples of low dielectric constant insulating materials include silicate glass, fluorosilicate glass (FSG), and carbon doped silicon oxide (SiOC), silicon carbide (SiC) and nitrogen containing silicon carbide (SiCN), among others. In an exemplary embodiment depicted herein, the material layer 308 is an undoped silicon glass (USG) layer. Suitable examples of the high-k material layer include hafnium dioxide ($HfO_2$), zirconium dioxide ($ZrO_2$), hafnium silicon oxide ($HfSiO_2$), hafnium aluminum oxide (HfAlO), zirconium silicon oxide ($ZrSiO_2$), tantalum dioxide ($TaO_2$), aluminum oxide, aluminum doped hafnium dioxide, bismuth strontium titanium (BST), and platinum zirconium titanium (PZT), among others. In one embodiment, the material layer 308 has a thickness between about 3000 Å to about 15000 Å, such as between about 4000 Å to about 12000 Å, for example about 10000 Å.

Figure 3A:
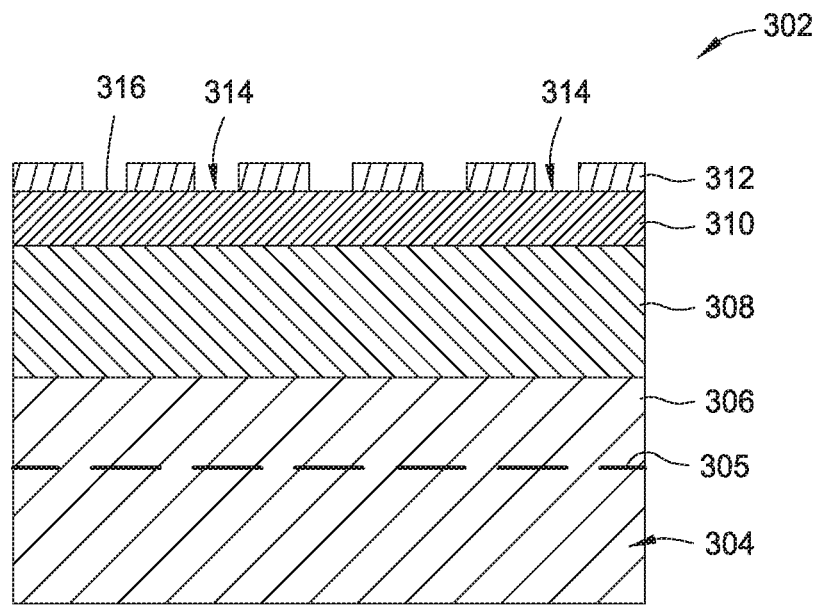
FIGS. 3A-3D depict a film stack at various stages during an etching process to etch a hardmask layer in a substrate utilizing the process depicted in FIG. 2.

In the embodiment depicted in FIG. 3A, the material layer 308 is a silicon oxide layer having a thickness between about 10 nm and about 10,000 nm. The hardmask layer 310 is a tungsten doped amorphous carbon layer. In one example, the ratio of the tungsten elements doped in the amorphous carbon for the hardmask layer 310 is about 20% and about 40%, such as about 30%.

Figure 3B:
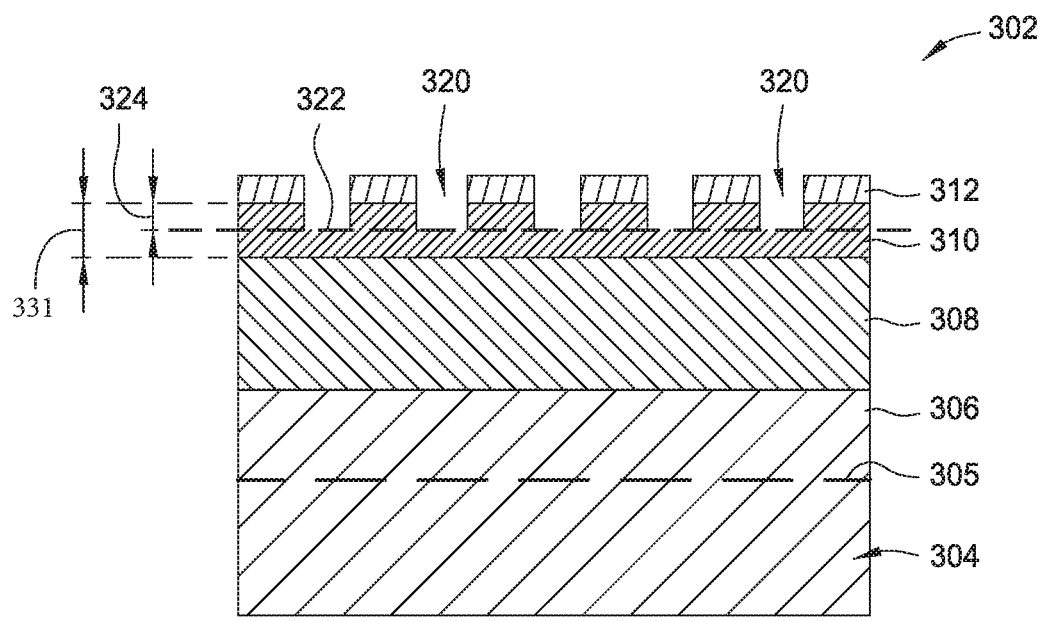

At operation 204, an etching process is performed to etch the hardmask layer 310, as shown in FIG. 3B. During etching, a selected etching gas mixture is supplied into the processing chamber 100 to etch the hardmask layer 310. The etching process may be performed by supplying an etching gas mixture to etch the hardmask layer 310. During etching, a portion of the hardmask layer 310 on the substrate 304 is etched and removed from the exposed surface 316, forming a surface 322 in opening portions 320, as shown in FIG. 3B. The portion may have a predetermined depth 324 between about 5% and 10% of a total thickness 331 of the hardmask layer 310.

In one example, the total thickness 331 of the hardmask layer 310 is between about 400 nm and about 600 nm, such as about 500 nm. The depth 324 removed from the etching process at operation 204 is between about 20 nm and about 40 nm, such as about 30 nm. The etching time is between about 20 seconds and about 30 seconds.

The etching gas mixture supplied at operation 204 may include any gas suitable for etching a hardmask layer. In one embodiment, the etching gas mixture may include, but not limited to, a halogen containing gas and/or carbon and fluorine containing gas, such as chlorine gas ($Cl_2$), nitrogen trifluoride ($NF_3$), sulfur hexafluoride gas ($SF_6$), $CF_4$, $CHF_3$, $C_4F_8$ or among others. Additionally, an inert gas is also supplied in the etching gas mixture. Suitable examples of the inert gas include argon (Ar), helium (He), and the like.

Several process parameters are regulated while the etching gas mixture supplied into the etch chamber. In one embodiment, the chamber pressure in the presence of the etching gas mixture is regulated. In one example, a process pressure in the etch chamber is regulated between about 2 mTorr to about 100 mTorr, for example, at about 10 mTorr. RF source power may be applied to maintain a plasma formed from the etching process gas. For example, a RF source power of about 100 Watts to about 1500 Watts may be applied to an inductively coupled antenna source to maintain a plasma inside the processing chamber. The etching gas mixture may be flowed into the chamber at a rate between about 50 sccm to about 1000 sccm. A substrate temperature is maintained between about 20 degrees Celsius to about 150 degrees Celsius, such as between about 50 degrees Celsius and about 110 degrees Celsius.

Figure 3C:
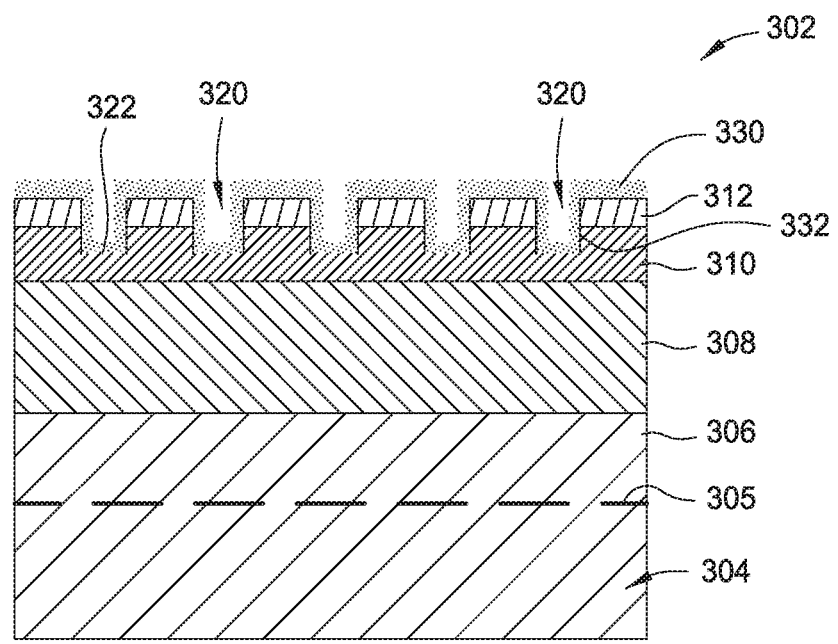

At operation 206, after the predetermined depth 324 is reached, a deposition gas mixture is supplied to form a passivation layer 330 on the exposed surfaces 322 of the hardmask layer 310, as well as the exposed sidewalls 332 of the hardmask layer 310, as shown in FIG. 3C. In one example, the deposition gas mixture include at least a silicon containing gas and an oxygen containing gas and, optionally, a halogen containing gas.

It is believed that the silicon containing gas as well as the oxygen containing gas supplied in the deposition gas mixture may facilitate forming the passivation layer 330 on the sidewall 332 and exposed surface 322 (e.g., bottom surface) of the hardmask layer 310 as well as on the patterned photoresist layer 312 for protection during the etching process, as shown in FIG. 3C.

In one example, the deposition process performed at operation 206 may form the passivation layer 330 having a thickness of between 2 nm and 10 nm, such as about 5 nm. The deposition time is about 5 seconds and about 15 seconds, such as about 10 seconds. It is noted that the passivation layer 330 may be predominately formed on the sidewalls 332 of the hardmask layer 310 and/or top surface of the patterned photoresist layer 312 so as to assist further etching the hardmask layer 310 through the exposed surface 322 of the hardmask layer 310, without substantially damaging the sidewalls 332 of the hardmask layer 310.

The passivation layer 330 serves as a passivation protection to protect the sidewalls 332 from being attacked while removing the remaining portion of the hardmask layer 310. As such, the passivation layer 330 is formed to assist further etching the to-be-etched portions of the hardmask layer 310 more protected and available for further etching to remove the remaining portion of the hardmask layer 310.

In one embodiment, the deposition gas mixture is formed in situ (e.g., performed in the same chamber) by switching the suppling of the etching gas mixture to the deposition gas mixture after the etching gas mixture is terminated from operation 204. The deposition gas mixture includes at least a silicon containing gas and an oxygen containing gas and, optionally, a halogen containing gas. Suitable examples of the oxygen containing gas include $O_2$, $N_2O$, $NO$, $CO$, $CO_2$, and the like. Suitable examples of the silicon containing gas include $SiH_4$, $SiCl_4$, $Si_2Cl_6$, and $SiF_4$ the like. Suitable examples of the halogen containing gas include $CHF_3$, $C_2F_6$, and $CF_4$ the like. In one specific example, the deposition gas mixture forms a silicon containing layer, such as a silicon oxide layer, for the passivation layer 330.

In one example, the deposition gas mixture includes $SiCl_4$ gas, $O_2$ gas and the $CHF_3$ gas. The $SiCl_4$ gas and the $CHF_3$ gas may be supplied in the first at a flow ratio (i.e., $SiCl_4:CHF_3$) by volume of between about 1:1 and about 10:1, for example about 2:1. The $SiCl_4$ gas and the $O_2$ gas may be supplied at a flow ratio (i.e., $SiCl_4:O_2$) by volume of between about 1:1 and about 1:100.

Several process parameters are regulated while the deposition gas mixture supplied into the etch chamber. In one embodiment, the chamber pressure in the presence of the deposition gas mixture is regulated. In one example, a process pressure in the etch chamber is regulated between about 2 mTorr to about 500 mTorr. RF source power may be applied to maintain a plasma formed from the etching process gas. For example, a RF source power of about 100 Watts to about 500 Watts, such as about 250 Watts, may be applied to an inductively coupled antenna source to maintain a plasma inside the processing chamber. A RF bias power of about 10 Watts to about 300 Watts, such as about 100 Watts, may be applied while supplying the deposition gas mixture. The substrate temperature is maintained between about 20 degrees Celsius to about 150 degrees Celsius, such as between about 50 degrees Celsius and about 110 degrees Celsius, similar to the temperature maintained while supplying the etching gas mixture at operation 204.

Figure 3D:
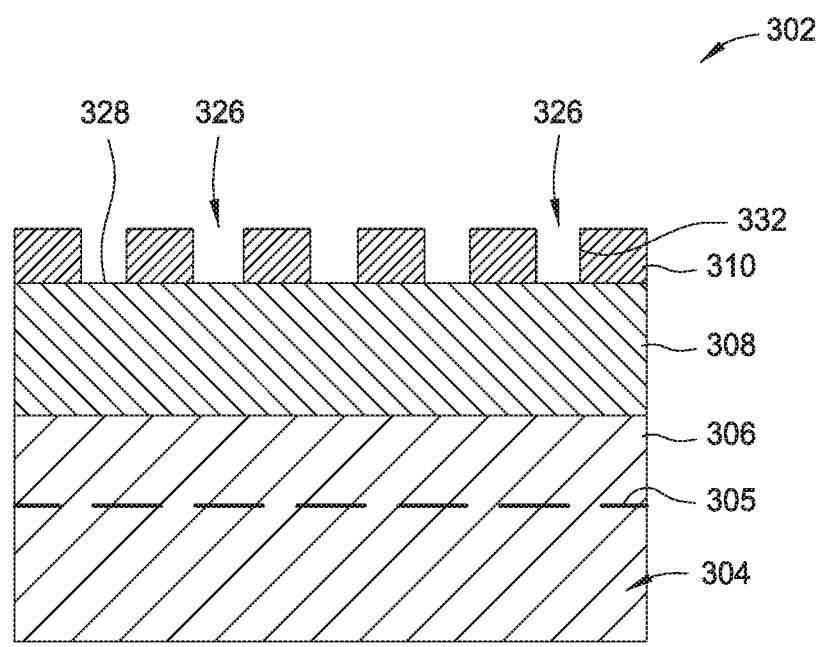

It is noted that the operations 204 and 206 may be repeatedly performed, as shown by the loop 210, until a surface 328 of the underlying material layer 308 is exposed, as shown in FIG. 3D. After the passivation layer 330 is formed on the hardmask layer 310 at operation 206, the deposition gas mixture supplied to the processing chamber 100 is then switched back (e.g., looped back) to the etching gas mixture at operation 204 to continue etching the hardmask layer 310 until the exposed portion of the hardmask layer 310 is removed from the substrate 304. While continuing etching the hardmask layer 310, the passivation layer 330 may be consumed and require replenishing. Thus, by repeatedly cycling the operations 204, 206, the hardmask layer 310 exposed by the patterned photoresist layer 312 may be continuously etched with good profile control and critical dimension (CD) management by the protection of the passivation layer 330. It is noted that the operations 204 and 206 may be repeatedly performed for between about 15 and 25 cycles, such as about 20 cycles, to remove the hardmask layer 310 exposed by the patterned photoresist layer 312 from the substrate 304 until the underlying material layer 308 is exposed.

It is noted that the time periods of the operations 204, 206 may have different durations. For example, a ratio of the time periods selected to perform the operations 204, 204 may be between about 5:1 and about 1:5, such as between about 3:1 and about 1:2, for example about 2:1. In one example, the time period selected to perform operation 204 may be about two times as long as the time period selected to perform operation 206. The time period for performing operation 204 is configured to be longer than the time period for performing operation 206.

Thus, by utilizing repetitive operations of etching and deposition processes with a selected etching gas mixture and deposition gas mixture, the hardmask layer 310 may be etched and shaped in a controlled manner that can provide the desired profile with the desired substantially sharp right angle and upright (e.g., straight, vertical) sidewalls 332 with desired slope and accurate dimensions.

Thus, embodiments of etching a hardmask layer to form features with desired edge/corner profile and desired aspect ratios are provided. By utilizing repetitive operations of etching and deposition processes as well as selected ratio and types of the gas mixture, a controlled ion trajectory/directionality as well as sidewall/corner passivation protection may be obtained so as to etch the hardmask in a desired manner that yields features in the hardmask layer with desired accurate angle, corners and vertical sidewall profile as well as feature aspect ratios.

While the foregoing is directed to embodiments of the present invention, other and further embodiments of the invention may be devised without departing from the basic scope thereof, and the scope thereof is determined by the claims that follow:

What is claimed is:

1. A method for etching a hardmask layer to form features in the hardmask layer, comprising:
   (a) supplying an etching gas mixture to etch a portion of an exposed portion of the hardmask layer exposed by a patterned photoresist layer disposed on a substrate;

(b) switching the etching gas mixture to a deposition gas mixture comprising a silicon containing gas to form a passivation layer on sidewalls of the hardmask layer; and (c) forming openings in the hardmask layer by repeating (a) and (b) until the exposed portion of the hardmask layer is removed.

2. The method of claim 1, wherein the hardmask layer is a dielectric layer.

3. The method of claim 1, wherein the hardmask layer is a doped amorphous carbon layer.

4. The method of claim 1, wherein the hardmask layer is tungsten doped amorphous carbon layer.

5. The method of claim 1, wherein the (a) supplying the etching gas mixture and the (b) switching the etching gas mixture to the deposition gas mixture is repeatedly performed until a surface of a material layer disposed under the hardmask layer is exposed.

6. The method of claim 1, wherein the deposition gas mixture further comprises oxygen, a fluorine containing gas, and a halogen gas.

7. The method of claim 6, wherein the halogen gas is $CHF_3$.

8. The method of claim 1, wherein the silicon containing gas is at least one of $SiH_4$, $SiF_4$, $SiCl_4$.

9. The method of claim 1, wherein the etching gas mixture comprises a halogen containing gas.

10. The method of claim 9, wherein the halogen containing gas is $Cl_2$.

11. The method of claim 1, wherein the etching gas mixture and the deposition gas mixture are supplied to a same processing chamber.

12. The method of claim 1, wherein the etching gas mixture is supplied for a first time period and the deposition gas mixture is supplied for a second time period, wherein a ratio of the first time period to the second time period is between about 3:1 and about 1:2.

13. The method of claim 12, wherein the first time period is longer than the second time period.

14. The method of claim 1, wherein the passivation layer is a silicon oxide layer.

15. A method for etching a hardmask layer to form features in the hardmask layer, comprising:

(a) supplying an etching gas mixture to etch a portion of an exposed portion of a hardmask layer exposed by a patterned photoresist layer disposed on a substrate, while supplying the etching gas mixture, a depth of between about 5% and 10% of a total thickness of the hardmask layer is removed;

(b) switching the etching gas mixture to a deposition gas mixture comprising a silicon containing gas to form a passivation layer on sidewalls of the hardmask layer; and (c) forming openings in the hardmask layer by repeating (a) and (b) until the exposed portion of the hardmask layer is removed.

16. A method for etching a hardmask layer to form features in the hardmask layer, comprising:

etching a hardmask layer disposed on a substrate to a predetermined depth, wherein the predetermined depth is between about 5% and 10% of a total thickness of the hardmask layer, wherein the hardmask layer is a doped amorphous carbon layer, the doped amorphous carbon layer being doped with one or more of boron or tungsten;

forming a passivation layer on sidewalls of the etched hardmask layer; and repeating the etching of the hardmask layer and the forming of the passivation layer until an opening of the hardmask layer is formed exposing an underlying material layer below the hardmask layer.

17. The method of claim 16, wherein the passivation layer is formed by a deposition gas mixture including $SiCl_4$ gas, $O_2$ gas and a $CHF_3$ gas.

18. The method of claim 16, wherein the hardmask layer is a tungsten doped amorphous carbon layer.

19. The method of claim 16, the hardmask layer is etched by an etching gas mixture including $Cl_2$ gas.

20. A method for etching a hardmask layer to form features in the hardmask layer, comprising:

etching a hardmask layer disposed on a substrate to a predetermined depth for a first period of time;

forming a passivation layer on sidewalls of the etched hardmask layer for a second period of time, wherein the first period of time is longer than the second period of time; and repeating the etching of the hardmask layer and the forming of the passivation layer until an opening is formed in the hardmask layer exposing an underlying material layer; and removing an exposed portion of the hardmask layer after exposing the underlying material layer, the exposed portion being exposed through the opening in a patterned photoresist layer disposed on the substrate.

* * * * *